United States Patent [19]

Okajima et al.

[11] Patent Number: 4,647,953
[45] Date of Patent: Mar. 3, 1987

[54] SEMICONDUCTOR LASER DEVICE AND METHOD FOR MANUFACTURING THE SAME

[75] Inventors: Masaki Okajima, Tokyo; Nawoto Motegi, Kanagawa; Yuhei Muto, Yokohama, all of Japan

[73] Assignee: Tokyo Shibaura Denki Kabushiki Kaisha, Kawasaki, Japan

[21] Appl. No.: 570,301

[22] Filed: Jan. 13, 1984

[30] Foreign Application Priority Data

Jan. 14, 1983 [JP] Japan .................................. 58-4457

[51] Int. Cl.[4] ............................................. H01L 33/00
[52] U.S. Cl. ......................................... 357/17; 372/50
[58] Field of Search ..................... 357/17; 372/7, 50; 350/96.12

[56] References Cited

PUBLICATIONS

Aiki et al., "Frequency Multiplexing Light Source . . . "; Appl. Phys. Letters; vol. 29, No. 8; 15 Oct. 1976; pp. 506-508.
Lee et al., "$Al_xGa_{1-x}As$ DH Rib-Waveguide Injection Laser"; IEEE J. of Quantum Electronics; vol. QE-11, No. 7; Jul. 1975; pp. 432-435.
Applied Physics Letters, vol. 37(3), (Aug. 1980), J. J. Coleman et al., "Single-Longitudinal-Mode Metalorganic Chemical-Vapor-Deposition Self-Aligned . . . ", pp. 262-263.
Applied Physics Letters, vol. 41(7), (Oct. 1982), P. M. Petroff et al., "Toward Quantum Well Wire: Fabrication and Optical Properties," pp. 635-638.

Primary Examiner—William L. Sikes
Assistant Examiner—Robert E. Wise
Attorney, Agent, or Firm—Oblon, Fisher, Spivak, McClelland & Maier

[57] ABSTRACT

A rib-waveguide semiconductor laser device comprising a first clad layer, an active layer, an optical rib-waveguide layer and a second clad layer, each composed of III-V semiconductor material, and sequentially formed on an insulating substrate or a III-V semiconductor substrate, wherein the rib-waveguide layer contains aluminum. A method for manufacturing the semiconductor laser device as defined above wherein the second clad layer is formed by metal-organic material chemical vapor deposition or molecular beam epitaxy.

9 Claims, 17 Drawing Figures

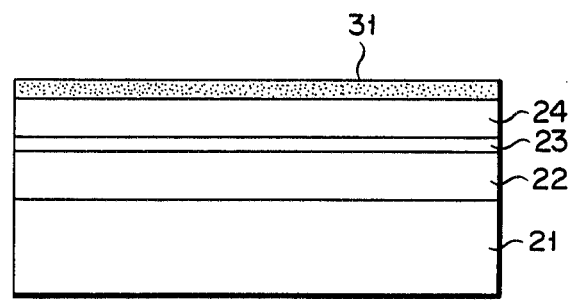
F I G. 4A
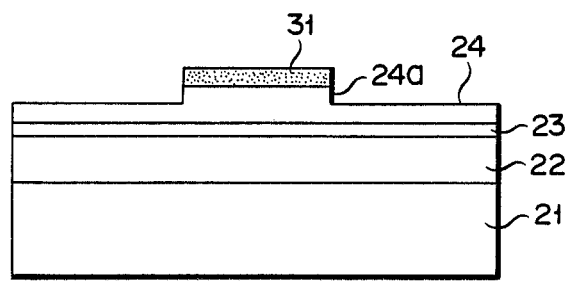
F I G. 4B
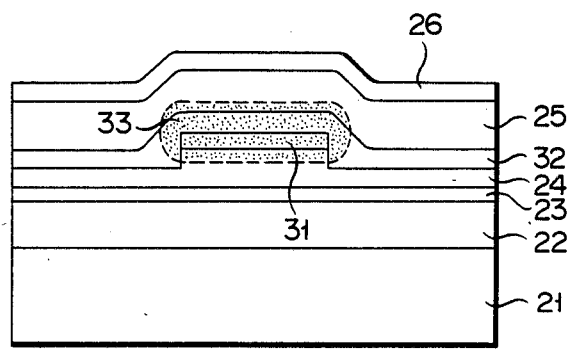
F I G. 4C

F I G. 4D
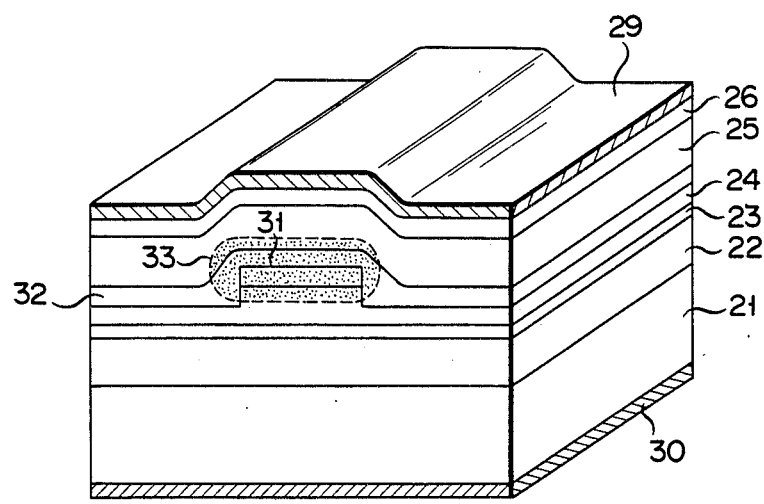
F I G. 5
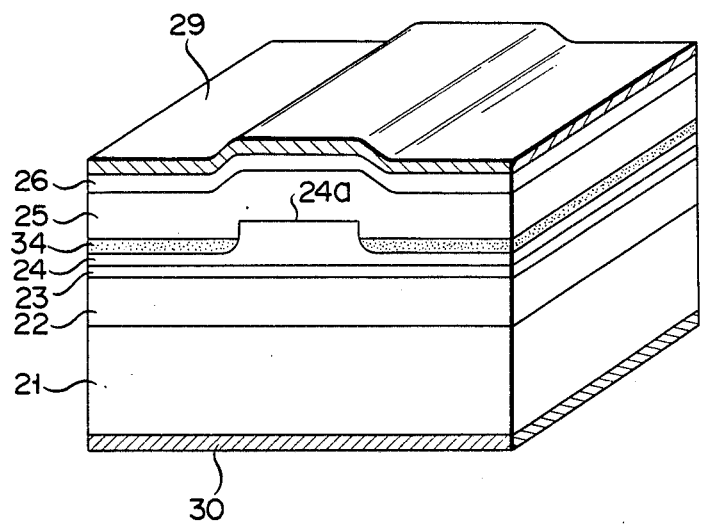

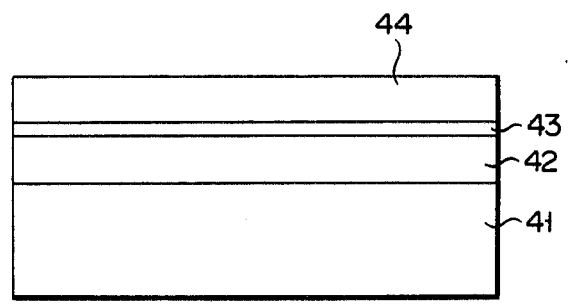
F I G. 6A
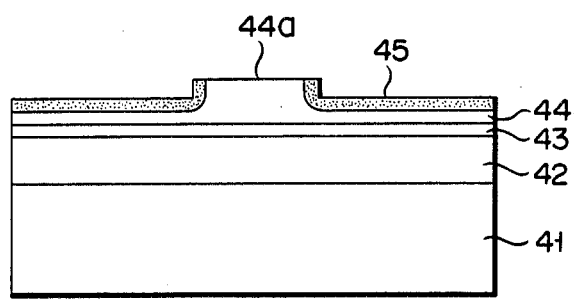
F I G. 6B
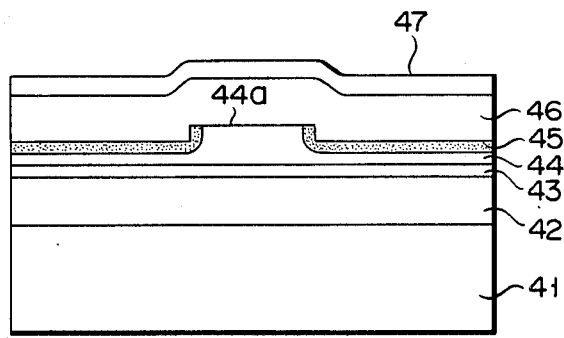
F I G. 6C

SEMICONDUCTOR LASER DEVICE AND METHOD FOR MANUFACTURING THE SAME

BACKGROUND OF THE INVENTION

1. Field of the Invention

The present invention relates to an improvement of a semiconductor laser device and a method for manufacturing the same and, more particularly, to a semiconductor laser device using a III-V group semiconductor material containing aluminum as a constituent element and a method for manufacturing the same.

2. Description of the Prior Art

Recently, a compound semiconductor laser has been developed wherein a III-V group semiconductor material is used to allow continuous oscillation at room temperature. In the semiconductor laser of this type, it is very important, for widening the range of applications, to control a transverse mode by a built-in waveguide structure and to obtain a laser beam of stable basic transverse mode oscillation which is free from astigmatism. A rib-waveguide laser shown in FIG. 1 is known as a typical example of a semiconductor laser having such a built-in waveguide structure. Referring to FIG. 1, reference numeral 1 denotes a semiconductor substrate; 2, a first clad layer; 3, an active layer; 4, a second clad layer; 5, an ohmic contact layer; 6, a current limiting insulating layer; 7 and 8, electrodes; and 9, a diffusion layer. The laser has a waveguide which is obtained by forming a projection (rib) 3a on the upper surface of the active layer 3 so as to change a refractive index. By changing a width W, a height H and a step difference $\Delta H$ and compositions of the respective layers, a desired transverse mode can be obtained. However, a difference $\Delta n$ between the refractive indices of the waveguide rib portion and the remaining portion is greatly increased in accordance with an increase in the step difference $\Delta H$. Therefore, in order to obtain the basic transverse mode, a strict manufacturing condition of, for example, $\Delta H \leq 500$ Å is required (T. P. Lee et al: IEEE J. Quantum Electron. QE-11, 432 (1975)). For this reason, it is difficult to manufacture the rib-waveguide laser of this type.

In order to solve the above problem, a semiconductor laser shown in FIG. 2 has recently been proposed wherein an optical waveguide layer 10 which has a refractive index smaller than that of an active layer 3 and greater than that of a clad layer 4 is formed in contact with the active layer 3, and a rib 10a is formed on the optical waveguide layer 10. Referring to FIG. 2, the remaining reference numerals are the same as those in FIG. 1. More particularly, reference numeral 1 denotes a semiconductor substrate; 2, a first clad layer; 5, an ohmic contact layer; 6, an insulating layer; 7 and 8, electrodes, respectively; and 9, a diffusion layer.

In this laser, the manufacturing condition becomes less strict such that $\Delta H \leq 0.2$ μm, and the manufacturing method is simplified. This laser has advantages in that the basic transverse mode can be easily obtained, and that the beam irradiation angle becomes small to obtain a high optical output.

However, in the laser of the type described above, when a material such as $Al_xGa_{1-x}$, $Al_xGa_{1-x}AsP$ and $In_y(Al_xGa_{1-x})_{1-y}P$ each containing aluminum as one of the constituent elements is used to form the optical waveguide layer 10, the structure shown in FIG. 2 cannot be obtained in good reproducibility. In order to obtain the structure shown in FIG. 2, crystal growth is performed up to the optical waveguide layer 10, and the rib 10a is formed on the optical waveguide layer 10 by etching or the like. Thereafter, the second clad layer 4 and the ohmic contact layer 5 are epitaxially grown, and the current limiting insulating layer 6 and the diffusion layer 9 are formed in the name ordered. Therefore, accurate mask alignment must be performed to form a resist film on a portion of the ohmic contact layer 5 which corresponds to the rib 10a.

In this case, since the rib 10a is buried in masking, the position of the rib 10a cannot be directly identified. Therefore, edges 5a of the projection of the ohmic contact layer 5 which is formed in correspondence with the shape of the rib can be used as a reference for masking.

However, when the second clad layer 4 and the ohmic contact layer 5 are formed by conventional liquid phase epitaxy (LPE), a protrusion having wave-like zigzag side edges of these layers 4 and 5 would be formed. This is considered to be due to local non-uniformities in crystal growth rate of these layers when LPE method is employed. Once an optical waveguide layer 10 containing aluminum is exposed to air atmosphere during the aforementioned etching step, an oxide layer is readily formed on the surface of the optical waveguide layer. As a result, the second clad layer 4 cannot be appreciably grown on such an oxidized surface. Even if the second clad layer 4 is grown to some degree, the non-uniformity of the second clad layer 4 becomes more conspicuous as compared with the case where aluminum is not included in the optical waveguide layer 10. Hence, masking for forming the current limiting region tends to become inaccurate, thereby deteriorating the performance and yield of the laser. In this sense, it was considered that the laser having the structure shown in FIG. 2 can be obtained when an InGaAsP semiconductor material which does not contain aluminum is used and the above laser cannot be obtained when a semiconductor material contains aluminum.

SUMMARY OF THE INVENTION

It is, therefore, an object of the present invention to provide a rib-waveguide semiconductor laser device and a method for manufacturing the same, wherein masking for forming a current limiting region can be easily formed even if an optical waveguide layer contains aluminum.

It is another object of the present invention to provide a rib-waveguide semiconductor laser device wherein a III-V group semiconductor material containing aluminum is used in accordance with the above method to control a laser oscillation wavelength to be short.

According to an aspect of the present invention, there is provided a semiconductor laser device wherein at least a first clad layer of a III-V semiconductor material, an active layer of a III-V semiconductor material, an optical waveguide layer of a III-V semiconductor material, and a second clad layer of a III-V semiconductor material are sequentially formed on an insulating substrate or a III-V semiconductor substrate, and a stripe-like projection is formed on the optical waveguide layer, characterized in that a content $Al_x$ of aluminum among the III group elements in the optical waveguide layer falls within the range of $x > 0.1$ (wherein the total amount of III group elements is defined as 1).

According to another aspect of the present invention, there is provided a method for manufacturing a semiconductor laser device, comprising the steps of: forming a first clad layer of a III-V semiconductor material and an active layer of a III-V semiconductor material on an insulating substrate or a III-V semiconductor substrate; growing on the active layer an optical waveguide layer of a III-V semiconductor material which contains aluminum as a constituent element; selectively etching the optical waveguide layer to form a stripe-like projection thereon; and forming a second clad layer of a III-V semiconductor material by metal-organic material chemical vapor deposition or molecular beam epitaxy on the optical waveguide layer.

The present invention is based on the principle wherein the clad layer and the ohmic contact layer are formed by metal-organic material chemical vapor deposition (to be referred to as MOCVD hereinafter) or molecular beam epitaxy (to be referred to as MBE hereinafter) on the optical waveguide layer comprising a III-V semiconductor material which contains aluminum among III group elements in an atomic ratio of 0.1 (generally 0.33 to 0.9), so that the clad layer and the ohmic contact layer are easily formed to have linear edges corresponding to the shape of the rib of the optical waveguide layer, whereby the linear edges can be used as a reference masking for forming a current limiting region.

According to the present invention, even if the optical waveguide layer containing aluminum as a constituent element is used, the rib-waveguide semiconductor laser as shown in FIG. 2 can be manufactured, thereby simplifying control of the transverse mode. Furthermore, since the semiconductor material containing aluminum is used, the laser oscillation wavelength can be short. The rib-waveguide semiconductor laser of this type can be effectively used as a read light source of a video disk or a DAD (digital audio disk) which is recently receiving a great deal of attention.

BRIEF DESCRIPTION OF THE DRAWINGS

FIGS. 4(A) to 4(C) are sectional views for explaining the steps of manufacturing a semiconductor laser according to a second embodiment of the present invention, and FIG. 4(D) is a perspective view thereof;

FIG. 5 is a perspective view of a semiconductor laser according to a third embodiment of the present invention;

FIGS. 6(A) to 6(C) are sectional views for explaining the steps of manufacturing a semiconductor laser according to a fourth embodiment of the present invention.

DETAILED DESCRIPTION OF THE PREFERRED EMBODIMENTS

A first embodiment of the present invention will be described with reference to FIGS. 3(A) to 3(E).

Figure 1:
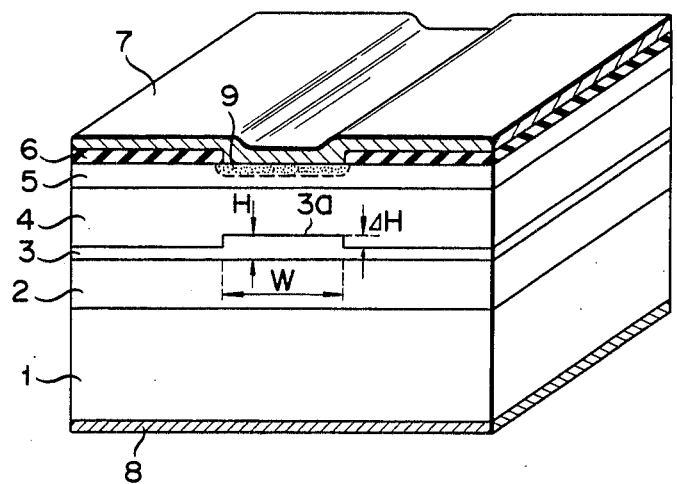
FIGS. 1 and 2 are perspective views showing the structures of conventional rib-waveguide semiconductor lasers, respectively.
Figure 2:
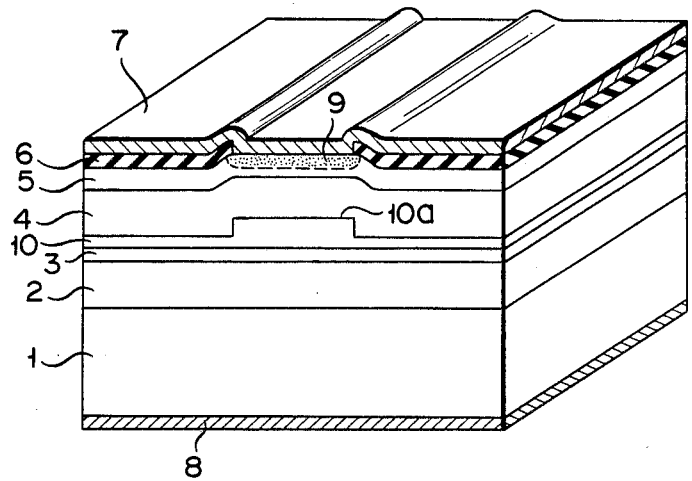
Figure 3A:
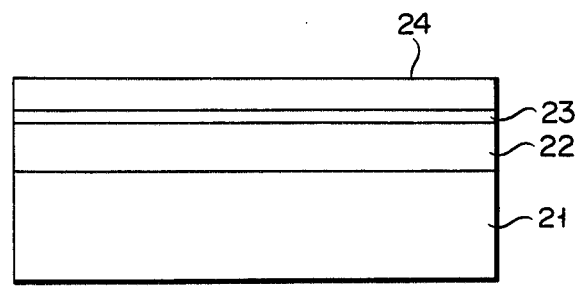
FIGS. 3(A) to 3(E) are sectional views for explaining the steps of manufacturing a semiconductor laser according to a first embodiment of the present invention.
Figure 3B:
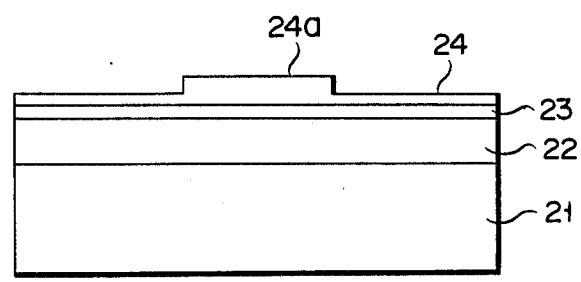

As shown in FIG. 3(A), an n-type $Al_{0.45}Ga_{0.55}As$ layer (first clad layer) 22, an undoped-$Al_{0.25}Ga_{0.85}As$ layer (active layer) 23 and a p-type $Al_{0.35}Ga_{0.65}As$ layer (optical waveguide layer) 24 were sequentially formed by the conventional LPE method on an n-type GaAs substrate 21. A photoresist film was used as a mask to selectively etch the optical waveguide layer 24 so as to form a stripe-like projection (rib) 24a on the surface of the optical waveguide layer 24, as shown in FIG. 3(B). Etching was performed by using an etchant mixture such as $CH_3OH$, $H_3PO_4$ and $H_2O_2$ (volume ratio is 3:1:1).

Figure 3C:
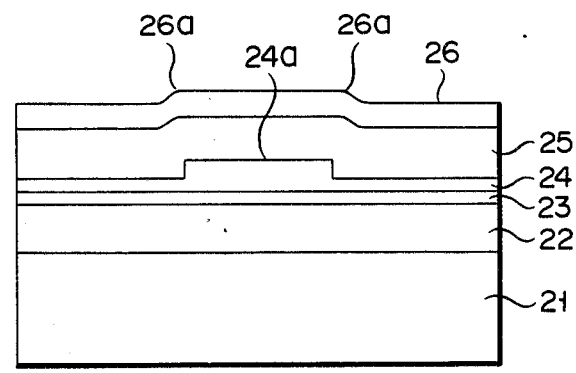

A p-type $Al_{0.45}Ga_{0.55}As$ layer (second clad layer) 25 and a p-type GaAs layer (ohmic contact layer) 26 were sequentially formed by the MOCVD method or the MBE method on the optical waveguide layer 24, as shown in FIG. 3(C). In this embodiment, the MOCVD method was used. The structure shown in FIG. 3(B) was sufficiently degreased and washed, and an oxide layer was removed by a diluted HCl solution or the like. The resultant structure was immediately placed in a reaction chamber. A crystal growth temperature was set to be 750° C., and materials used were trimethylgallium $((CH_3)_3Ga)$, trimethylaluminum $(CH_3)_3 Al)$ and arsine $(AsH_3)$. Diethylzinc $(C_2H_5)_2Zn$ was used as a p-type dopant. A molar ratio (As)/(Ga+Al) of the V group element (As) to the III group elements (Ga and Al) was 20. Under these conditions, the resultant structure was subjected to the MOCVD method. A good crystal growth was performed on the optical waveguide layer 24 so that linear edges 26a distinctly appeared.

Figure 3D:
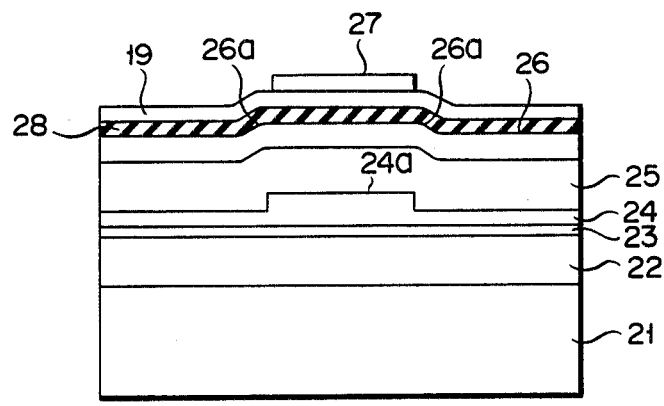
Figure 3E:
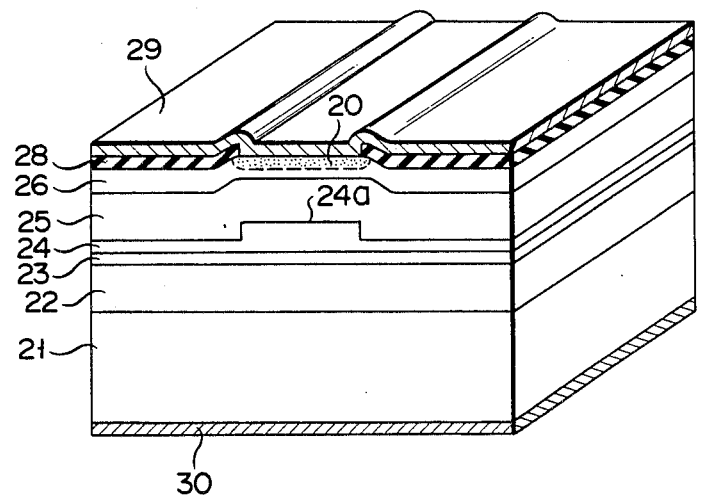

As shown in FIG. 3(D), after depositing a $SiO_2/Al_2O_3$ film 28 and a resist film 19 on the surface of the layer 26, the edges 26a of the ohmic contact layer 26 were used as a masking reference to align a mask 27 in position. Then, the whole surface was exposed to light and an unexposed portion of the resist film 19 which lies below the mask 27 was removed to expose the corresponding portion of the $SiO_2/Al_2O_3$ (insulating layer) 28. After the exposed portion of the $SiO_2/Al_2O_3$ film 28 was etched off, a Zn diffusion layer 20 was formed on the current limiting region of the ohmic contact layer 26 by using an $Al_2O_3$ layer as a mask as shown in FIG. 3(E). Then, Cr/Au electrodes 29 and 30 were formed, thereby preparing a semiconductor laser.

A thickness L and an impurity concentration N of the substrate and each layer were preset in the following manner: $L=80$ μm and $N_D=1\times10^{18}$ cm$^{-3}$ for the substrate 21; $L=1$ μm and $N_D=3\times10^{17}$ cm$^{-3}$ for the first clad layer 22; $L=0.12$ μm for the active layer 23; $L=0.5$ μm and $N_A 5\times10^{17}$ cm$^{-3}$ for the optical waveguide 24; $L=1$ μm and $N_A=5\times10^{17}$ cm$^{-3}$ for the second clad layer 25; and $L=0.5$ μm and $N_A=1\times10^{19}$ cm$^{-3}$ for the ohmic contact layer 26. The height $\Delta H$ of the rib 24a of the optical waveguide layer 24 was 0.2 μm, and the width W of the rib 24a was 3 μm.

The thus obtained semiconductor laser has the stable basic transverse mode oscillation by means of the rib 24a formed on the optical waveguide layer 24. Furthermore, since the semiconductor material contains aluminum, the oscillation wavelength can be short. For these reasons, the semiconductor laser of this embodiment can be effectively used as a read light source of a video disk or a DAD. The rib is not formed on the active layer 23 but on the optical waveguide layer 24, so that the step height $\Delta H$ of the rib 24a can be formed in a moderate condition ($\Delta H \leq 0.2$ μm), and its manufacturing method can be simplified. In addition, since the active layer 23 is not exposed, a crystal defect tends not to occur in the light-emitting region.

A second embodiment of the present invention will be described with reference to FIGS. 4(A) to 4(D). The same reference numerals used in FIGS. 3(A) to 3(E) denote the same parts in FIGS. 4(A) to 4(D), and a detailed description thereof will be omitted.

The second embodiment mainly differs from the first embodiment wherein a diffusion layer is used in place of the $SiO_2$ film 28 to constitute a current limiting structure. In the same manner as in the first embodiment, a first clad layer 22, an active layer 23 and an optical waveguide layer 24 were formed on a substrate 21, as shown in FIG. 4(A). A $p^+$-type GaAs (Zn diffusion layer) 31 which was doped with zinc of a high concentration ($P > 1 \times 10^{19}$ cm$^{-3}$) was grown on the optical waveguide layer 24. Thereafter, the Zn diffusion layer 31 and the optical waveguide layer 24 were selectively etched to form a rib structure shown in FIG. 4(B). Subsequently, as shown in FIG. 4(C), an n-type $Al_{0.45}Ga_{0.55}As$ layer (third clad layer) 32, the second clad layer 25 and an ohmic contact layer 26 were sequentially formed by the MOCVD method on the resultant structure. Hydrogen selenide ($H_2Se$) was used as an n-type dopant. A thickness L and an impurity concentration N of the third clad layer 32 were set to be L=0.5 μm and $N_D = 3 \times 10^{17}$ cm$^{-3}$.

The resultant structure was annealed at a temperature of 900° C. to diffuse zinc from the Zn diffusion layer 31, thereby converting the third clad layer 32 on the rib to a p-type layer. The impurity concentration of a Zn diffusion region 33 thus formed was $N_A = 1 \times 10^{18}$ cm$^{-3}$. Thereafter, electrodes 29 and 30 were formed on two major surfaces of the structure shown in FIG. 4(C), thus preparing a semiconductor laser having the structure shown in FIG. 4(D).

In the semiconductor laser thus obtained, the diffusion region 33 serves as a current limiting structure, so that the light-emitting region of the active layer 3 can be defined in a stripe-like manner. For this reason, the second embodiment has the same effect as in the first embodiment. In addition, the $SiO_2$ film as the current limiting structure need not be used, and the overall structure is simplified. Zinc tends to be diffused in the third clad layer 32 rather than in the optical waveguide layer 24 since the third clad layer 32 contains a greater amount of aluminum. Therefore, the diffusion layer 33 can be formed not to reach the active layer 23 but to reach the second clad layer 25.

FIG. 5 shows a semiconductor laser according to a third embodiment. In this semiconductor laser, a first clad layer 22, an active layer 23 and an optical waveguide layer 24 are grown on a substrate 21 in the same manner as in the first embodiment. In the same state as in FIG. 3(B) wherein a rib 24a is formed on the optical waveguide layer 24, oxygen is ion-implanted in a region excluding the rib 24a to form an ion implantation layer 34. In this case, the ion implantation layer 34 must not reach the active layer 23. Thereafter, in the same manner as in the first embodiment, by using the MOCVD method, a second clad layer 25 and an ohmic contact layer 26 are grown, and electrodes 29 and 30 are formed to prepare the semiconductor laser. A crystal growth temperature in the MOCVD method is set to be 750° C. or lower to prevent the ion implantation layer 34 from a low resistance, thereby forming a high resistance layer for current limiting.

A fourth embodiment will be described with reference to FIGS. 6(A) to 6(D).

Figure 6D:
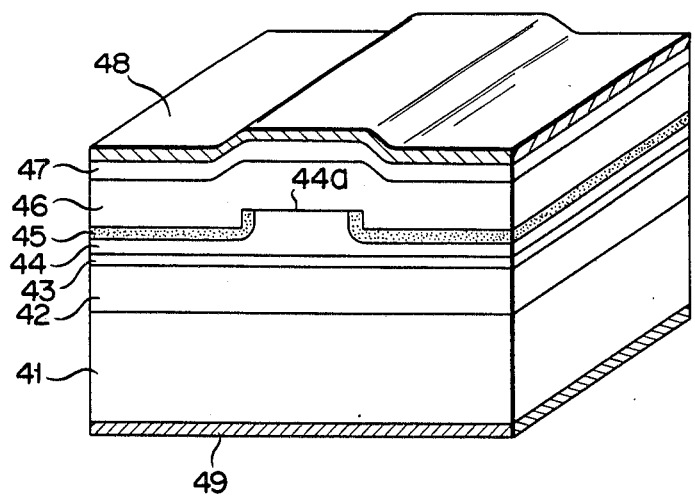
FIG. 6(D) is a perspective view thereof.

As shown in FIG. 6(A), a p-type $Al_{0.45}Ga_{0.55}As$ layer (first clad layer) 42, an undoped-$Al_{0.15}Ga_{0.85}As$ layer (active layer) 43 and an n-type $Al_{0.35}Ga_{0.65}As$ layer (optical waveguide layer) 44 are subsequently formed by the LPE method on a p-type GaAs substrate 41. The optical waveguide layer 44 is selectively etched to form a rib 44a, as shown in FIG. 6(B). Thereafter, zinc is diffused in the entire surface of the optical waveguide layer 44 which excludes the upper surface of the rib 44a to form a Zn diffusion layer 45. In this case, a diffusion temperature and its time must be controlled such that the Zn diffusion layer 45 does not reach the active layer 43. Subsequently, by using the MOCVD method or the MBE method, an n-type $Al_{0.45}Ga_{0.55}As$ layer (second clad layer) 46 and an n-type GaAs layer (ohmic contact layer) 47 are sequentially formed, as shown in FIG. 6(C). Thereafter, electrodes 48 and 49 are formed as shown in FIG. 6(D) to prepare the semiconductor laser.

In this semiconductor laser shown in FIGS. 5 and 6(D), the ion implantation layer 34 or the Zn diffusion layer 45 serve as the current limiting region. Therefore, the third embodiment has the same effect as in the second embodiment.

Figure 7:
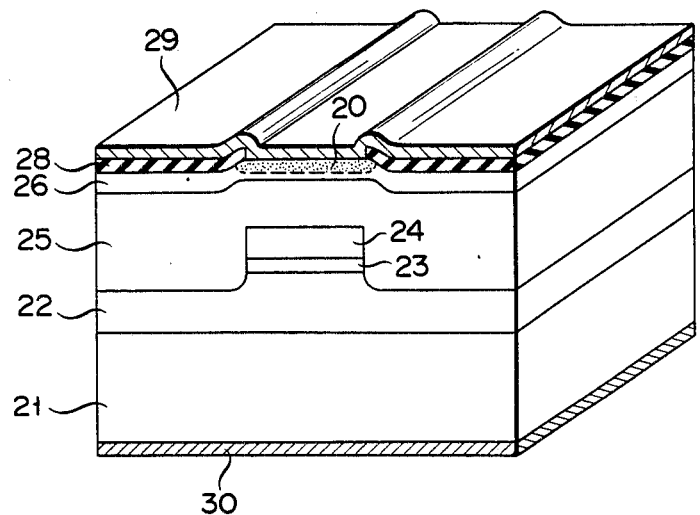
FIG. 7 is a perspective view of a semiconductor laser according to a fifth embodiment of the present invention.

FIG. 7 shows a fifth embodiment of the present invention. This embodiment is a modification of the first embodiment. The fifth embodiment is substantially the same as the first embodiment except that part of the first clad layer 22 is etched through the active layer 23 when the optical waveguide layer 24 is selectively etched in the same state as in FIG. 3(B). By this construction, a current more easily flows in the optical waveguide layer 24. Any other construction of the fifth embodiment is substantially the same as that of the first embodiment, and a detailed description thereof will be omitted.

The present invention is not limited to the above embodiments. For example, the material of the optical waveguide layer is not limited to an $Al_xGa_{1-x}As$ type semiconductor, but extended to an $Al_xGa_{1-x}Ga_{1-x}AsP$ type or $In_y(Al_xGa_{1-x})_{1-y}P$ type semiconductor. It is essential to use a III-V semiconductor compound containing aluminum, especially, a compound wherein a content x of aluminum is x > 0.1. In the above embodiments, the first clad layer, the active layer and the optical waveguide layer are formed by the LPE method. However, these layers may be formed by the MOCVD method or the MBE method. In addition to these modifications, an insulating substrate such as sapphire may be used in place of a III-V semiconductor substrate. Furthermore, the thicknesses L and the impurity concentrations of the substrate and the respective layers may change as needed. Other changes and modifications may be made within the spirit and scope of the present invention.

What is claimed is:

1. A semiconductor laser device having at least a first clad layer of a III-V semiconductor material, an active layer of a III-V semiconductor material, an optical waveguide layer of a III-V semiconductor material, and a second clad layer of a III-V semiconductor material which are sequentially formed on one of an insulating substrate and a III-V semiconductor substrate, and a stripe-like projection is formed on said optical waveguide layer, wherein said optical waveguide layer contains aluminum among III group elements in a ratio (as expressed by $Al_x$) of x > 0.33 (where a total content of all III group elements is given to be 1).

2. A device according to claim 1, wherein said optical waveguide layer comprises a material selected from the group consisting of an $Al_xGa_{1-x}As$ type semiconductor, an $Al_xGa_{1-x}AsP$ type and an $In_y(Al_xGa_{1-x})_{1-y}P$ type semiconductor.

3. A device according to claim 1, further comprising an impurity diffusion layer in a vicinity of said optical waveguide layer to perform current limiting.

4. A device according to claim 1, further comprising an impurity diffusion layer on an upper surface of said optical waveguide layer at two edges of said stripe-like projection.

5. A device according to claim 1, further comprising an insulating layer on an upper surface of said optical waveguide layer at two edges of said stripe-like projection.

6. A device according to claim 1, wherein x in $Al_x$ is in the range of 0.33 to 0.9.

7. A method for manufacturing a semiconductor laser device, comprising the steps of:
  (i) forming a first clad layer of a III-V semiconductor material and an active layer of a III-V semiconductor material on one of an insulating substrate and a III-V semiconductor substrate;
  (ii) growing on said active layer an optical waveguide layer of a III-V semiconductor material which contains aluminum as a constituent element;
  (iii) selectively etching said optical waveguide layer to form a stripe-like projection thereon; and
  (iv) forming a second clad layer of a III-V semiconductor material by one of metal-organic material chemical vapor deposition and molecular beam epitaxy on said optical waveguide layer.

8. A method according to claim 7, further comprising a step (v) of forming said second clad layer and an ohmic contact layer after said step (iv).

9. A method according to claim 8, further comprising a step (vi) of aligning a mask with said projection by referring to both side edges of said ohmic contact layer after the step (v) for defining a current limiting region.

* * * * *